(12) United States Patent
McGrew

(10) Patent No.: US 6,346,668 B1
(45) Date of Patent: Feb. 12, 2002

(54) MINIATURE, THIN-FILM, SOLID STATE CRYOGENIC COOLER

(76) Inventor: Stephen P. McGrew, 9715 W. Sunrise Hwy., Spokane, WA (US) 99224

( * ) Notice: Subject to any disclaimer, the term of this patent is extended or adjusted under 35 U.S.C. 154(b) by 0 days.

(21) Appl. No.: 09/687,607

(22) Filed: Oct. 12, 2000

Related U.S. Application Data

(60) Provisional application No. 60/159,201, filed on Oct. 13, 1999.

(51) Int. Cl.$^7$ ............................................... H01L 35/00
(52) U.S. Cl. ....................... 136/200; 136/204; 136/205; 136/242
(58) Field of Search ............................... 136/203, 204, 136/242; 62/3.2, 3.3

(56) References Cited

U.S. PATENT DOCUMENTS 3,899,359 A * 8/1975 Stachurski .................. 136/205

* cited by examiner

Primary Examiner—Kathryn Gorgos
Assistant Examiner—Thomas H Parsons
(74) Attorney, Agent, or Firm—Dorsey & Whitney LLP

(57) ABSTRACT

The invention provides a solid-state cooler that provides counter-current electricity flow through a device that includes Peltier junctions interconnecting the opposing flow of current through the device. The combination of counter-current flow with the Thompson, Peltier, and Seebeck thermoelectric effects provides an apparatus having the advantages of high energy efficiency, very small size and the ability to reach very low temperatures (near liquid nitrogen temperatures) with minimal energy input. The cooling apparatus is suitable for use in variety of applications, including superconductive devices such a superconductive Quantum Interference Devices (SQUID's) used in medical imaging to increase the sensitivity and resolution of NMR techniques. It is also provides a useful tool for cryosurgery aplications without the risks associated with the use and storage of liquid nitrogen. In addition, the device can be operated in the reverse to generate current from small gradients of temperature.

13 Claims, 4 Drawing Sheets

MINIATURE, THIN-FILM, SOLID STATE CRYOGENIC COOLER

CROSS-REFERENCE TO RELATED APPLICATION

This application claims priority to U.S. provisional patent application No. 60/159,201, filed Oct. 13, 1999.

BACKGROUND OF THE INVENTION

1. Technical Field

The invention relates to the field of thermoelectric cooling devices, and more particularly, to solid-state cooling devices that include Peltier junctions to aid in the cooling process.

2. Description of the Related Art

Temperature is a crucial parameter in an enormous number of physical, chemical and biochemical processes and particularly in a variety of medical and electronic devices that can be operated more effectively at very cold temperatures. While thermoelectric coolers currently in use can readily reach and maintain temperatures in a range of 300 K (room temperature) to 230 K, there is no solid-state cooler capable of reaching temperatures below 160 K.

Thermoelectric coolers, also known as Peltier coolers, have existed for many decades, but they have been unable to achieve temperatures cooler than about 210 K primarily because their efficiency drops in proportion to the temperature difference across them. This fact is partly due to the temperature dependence of the properties of thermoelectric materials, but is also largely due to the traditional "brute force" structure of refrigeration devices including Peltier coolers FIG. 1 illustrates a standard Peltier cooler designed to reach low temperatures (~200 K). It consists of a cascade of zigzag structures of junctions between n-type and p-type semiconductors, sandwiched between ceramic plates. When a current flows through the structure, its top face absorbs heat from the environment and its bottom face releases heat to the environment. In other words, the device pumps heat from one face to the other.

Several conflicting processes are at work in this type of Peltier cooler. The current flow pumps heat as a result of the Peltier effect, but heat is generated by the $I^2R$ resistive heating. As heat is pumped, a temperature difference builds between the two faces of the device, so the Seebeck effect generates a voltage which opposes the current creating the temperature difference. Ordinary thermal conduction also allows some heat to flow back toward the cold side. The Thompson effects nearly cancel out in this device, so the Thompson effect is usually ignored.

The maximum temperature difference which can be developed by a standard single-stage Peltier cooler with no heat load is about 70 degrees Centigrade. Larger temperature differences, up to 140 degrees Centigrade, can be attained in multistage devices like that illustrated in FIG. 2. However, the pumping efficiency becomes very poor because each stage not only pumps heat that must be pumped in turn by the next stage, but each stage also generates resistive heat that must be pumped in turn by the next stage.

From a different art, in the design of ordinary fluid heat exchangers used in the heating industry it is standard practice to run fluid in opposite directions through two pipes in thermal contact as illustrated in FIG. 3. This works much better than moving the fluid in the same direction through the two pipes. A significant feature of fluid counterflow heat exchangers is that the temperature difference between the two pipes is nearly zero everywhere along the exchanger, even though there can be a very strong temperature gradient along the length of the pipes.

Fluid counterflow also occurs in the natural world where a continuous loop may form a fluid counterflow exchange amplifier, which is essentially a counterflow exchanger in which the fluid flows as illustrated in FIG. 3, but in which a component of the fluid is separated from the incoming flow and pumped across to the outgoing flow as indicated in FIG. 4. This occurs, for example, in the ocean, where nutrients are concentrated at the shoreline by a counterflow process. The incoming fluid flows toward the shore along the bottom carrying nutrients, is warmed and flows away from the shore along the surface while gravity pulls the nutrients down to the incoming flow from the outgoing flow, trapping the nutrients in a loop. In another example, one mechanism by which living organisms maintain large ion concentration gradients in certain tissues such as the kidney, is by counterflow amplification of the solute concentration in fluids flowing across semi-permeable membranes that connect kidney nephrons to blood vessels in counter-directional flow.

There is a need in the art to provide a thermoelectric cooler of a new design which can overcome the limitations of previous coolers and avoid some of the constraints that material properties impose on thermoelectric cooling. Further, there is a need to provide miniature thin film solid state coolers that are useful in computer applications.

SUMMARY OF THE INVENTION

The present disclosure fulfills these needs and others that will become apparent from the present description, by providing a thermoelectric cooler design that combines the advantages of counter-current flow with the advantages of Peltier cooler and which can be fabricated in a miniature scale using thin-film solid state materials used in the semiconductor arts.

More particularly, one aspect, the thermoelectric cooler provided herein includes, a counter-current exchange conductor having a conductive path between a first conductive zone and a second conductive zone, where current flows in substantially an opposite direction in the first conductive zone with respect to the second conductive zone; and a Peltier junction in thermoelectric contact between the first conductive zone and the second conductive zone.

Certain embodiments of this aspect include a plurality of Peltier junctions in thermoelectric contact between the first conductive zone and the second conductive zone. In other embodiments, the Peltier junction includes a heat transfer material, a first conductive material in thermoelectric contact with the heat transfer material and in conductive contact with a second conductive material different than the first conductive material, and a third conductive material different from the second conductive material, the third material in thermoelectric contact with the heat transfer material and in conductive contact with the first material.

In more particular embodiments of this aspect, the heat transfer material includes a warming region and a cooling region, the warming region being in thermoelectric contact with a first zone of the counter-current exchange conductor and the cooling region being in thermoelectric contact with the second zone of the counter-current exchange conductor. Other particular embodiments of this aspect include the use of a plurality of Peltier junctions that include the aforementioned heat transfer material.

In certain embodiments, the thermoelectric cooling apparatus includes thin film conductive materials. In particular embodiments, the second or third conductive material described above includes $(Bi,Sb)_2(Te,Se)_3$.

In another aspect, the invention provides a thermoelectric cooling apparatus having a cold end and a hot end, wherein the hot end is about room temperature and the cold end is about 70–100 degrees K.

In yet another aspect, there is provided, devices that include various types of thermoelectric cooling apparatus having the aforementioned features. One particular embodiment of this aspect is a superconductive quantum interference device.

In still another aspect, there is provided a method of cooling an object, that includes the steps of: forming a counter-current exchange conductor to have a conductive path between a first conductive zone and a second conductive zone; so that current passing through the counter-current exchange device flows in substantially an opposite direction in the first conductive zone with respect to the second conductive zone; forming a Peltier junction in thermoelectric contact between the first conductive zone and the second conductive zone; passing current through the counter-current exchange conductor through a circuit that includes the Peltier junction to form a cold end; and cooling the object by placing it in radiant, thermoconductive, or conductive contact with the cold end.

In another aspect, the thermoelectric cooler provided herein can be run in reverse, which provides a method of generating electricity from a temperature gradient that includes the steps of: forming a counter-current exchange conductor to have a conductive path between a first conductive zone and a second conductive zone; so that current passing through the counter-current exchange device flows in substantially an opposite direction in the first conductive zone with respect to the second conductive zone; forming a Peltier junction in thermoelectric contact between the first conductive zone and the second conductive zone; positioning a first portion of the current exchange conductor in proximity to a substance having first temperature and positioning a second portion of the current exchange conductor in proximity to a substance having a second temperature; and drawing electricity from the first or second conductive zones.

As will be apparent to one of ordinary skill in the art from the disclosure provided herein, counter-current thermoelectric cooler devices can be embodied in numerous forms for application to a wide range of fields. The ability to cool small volumes to below 100 K allows practical application of high-temperature superconducting quantum interference devices (SQUID's) in NMR imaging and infrared imaging. In addition, the present cooler is useful in computer applications wherever it is possible to maintain a superconductive integrated circuit at 100 K on a printed circuit board, for example, in the internal environment of a desktop computer. Devices cooled by the thermoelectric cooler provided herein make a wealth of new applications possible, taking advantage of the high switching speed, high density and low power consumption of superconducting electronics as well as the high sensitivity of superconductive IR arrays and magnetic field sensors. In other embodiments, the cooler will enable researchers to maintain precisely controlled temperature gradients of very high magnitude in small regions, to study and control biochemical processes and to measure thermal and electronic properties of materials. In still other embodiments, the cooler is useful in spectral hole-burning optical memories that provide thousand times more capacity than current media. In yet other embodiments, the cooler is useful in sensitive coupled quantum well devices and in molecular electronics.

DETAILED DESCRIPTION

The present disclosure may be better understood by reference to certain thermoelectric effects and mathematical representations of the same.

Figure 5:
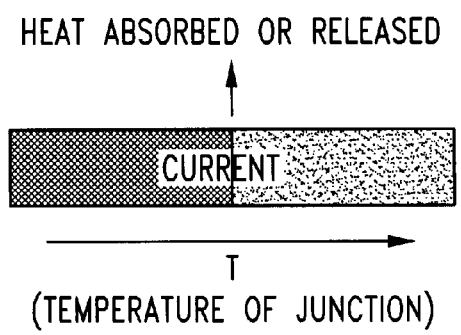
FIG. 5 graphically depicts the Peltier effect.
Figure 6:
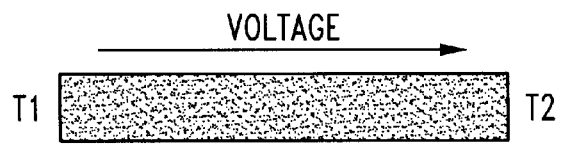
FIG. 6 graphically depicts the Seebeck effect.
Figure 7:
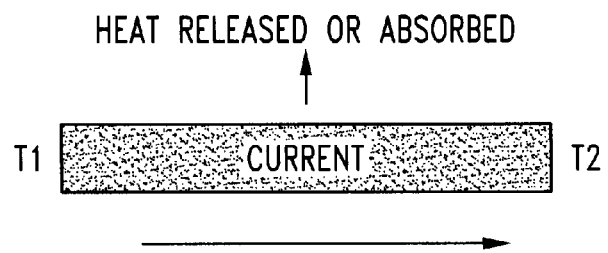
FIG. 7 graphically depicts the Thompson effect.

There are three closely related thermoelectric effects applicable to cooler design: the Seebeck effect, the Thompson effect, and the Peltier effect. In the Peltier effect, graphically depicted in FIG. 5, an electric current running through a junction between two dissimilar conductors either releases or absorbs heat depending on the direction of current flow and the nature of the charge carriers. In the Seebeck effect, graphically depicted in FIG. 6, a temperature difference between two junctions of dissimilar metals generates a voltage whose magnitude and direction depend on the temperature difference and the nature of the metals. In the Thompson effect, graphically depicted in FIG. 7, heat is released when current runs along a temperature gradient in a conductor, with a sign and magnitude depending on the nature of the charge carriers in the conductor, the Fermi levels, and the temperature gradient. All three of these effects are interrelated, and it is generally accepted that the Thompson and Peltier effects arise from the Seebeck effect.

The equations describing the thermoelectric effects are:

Seebeck Effect: $\Delta V_{-} = S(T_1 - T_2)$

Thompson Effect: $\Delta H_T = \sigma I_{-}(T_1 - T_2)$

Peltier Effect: $\Delta H_P = \alpha_{AB} I_P T$ where:

$\Delta H_T$ or $\Delta H_P$ equals the rate of heat released or absorbed

T equals the average temperature of the device $\sigma$ is the Thompson coefficient $\alpha_{AB}$ is the Peltier coefficient $K_P$ is the thermal conductance of the device $\Delta V_{-}$ is the Seebeck voltage generated by the temperature difference In a typical device, there is also always a Joule heating term and a thermal conduction term:

Joule Heating: $\Delta H_j = I^2 R$

Thermal Conduction: $\Delta H_- = K(T_1 - T_2)$ where R is the electrical resistance of the device, and I is the electrical current through the wire.

Figure 1:
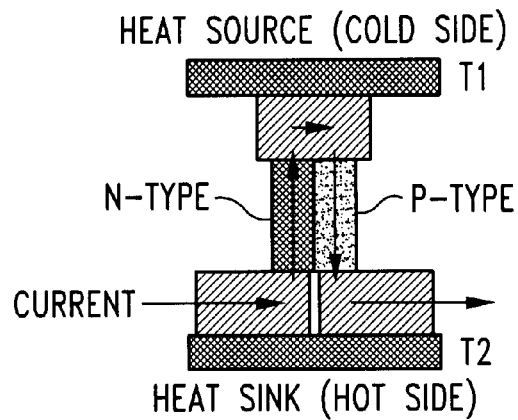
FIG. 1 illustrates one embodiment of a standard Peltier Cooler according to the prior art.
Figure 2:
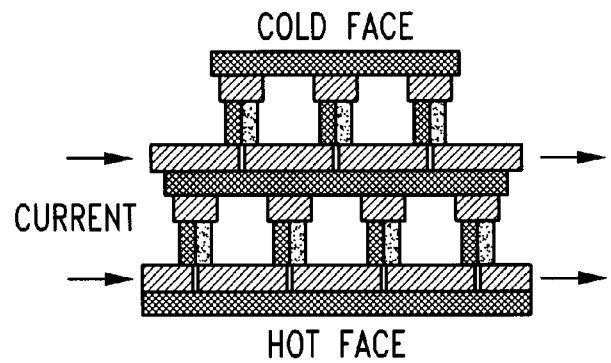
FIG. 2 illustrates another embodiment of a standard Peltier cooler according to the prior art.
Figure 3:
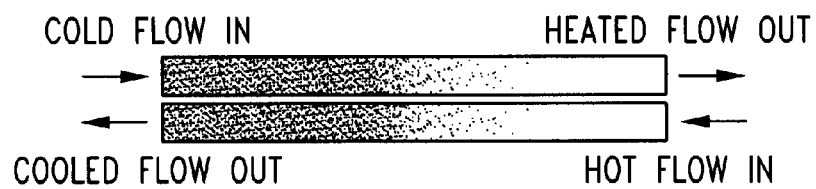
FIG. 3 illustrates a fluid counterflow heat exchanger according to the prior art.
Figure 4:
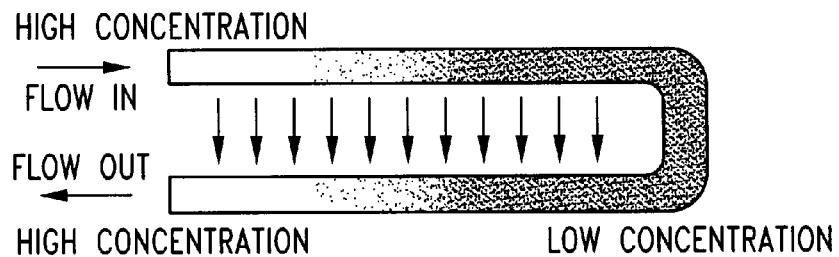
FIG. 4 illustrates a fluid counterflow amplifier according to the prior art.

A standard Peltier cooler, illustrated in FIG. 1, is normally described by the equation:

$$\Delta H = \alpha_{AB} I T + \tfrac{1}{2} I^2 R + K_P (T_1 - T_2)$$

assuming that half of the Joule heat flows in each direction.

In visualizing these effects at work, it is helpful to imagine that electrons (or holes) are a gas carried by wires which act like pipes. The electron gas carries heat just as an actual gas does, and it can be compressed just as an actual gas can be. In addition, though, the heat capacity of the electron gas depends on the nature of the material from which the wire is made. That is, a unit quantity of electrons in one kind of metal at a given temperature will carry a different amount of heat than the same quantity of electrons in a different kind of metal. The Thompson coefficient corresponds to the heat capacity of a charge carrier.

The Peltier effect results from the fact that the electron gas must release or gain heat to stay at a given temperature as it flows across a junction from one kind of metal to another kind of metal. The Seebeck effect results from the fact that the density of the electron gas is greater when its temperature is lower, so charge carriers will tend to concentrate at the cold end of a wire. The Thompson effect arises from the fact that an electron gas must gain heat in order for its temperature to be raised while it remains in a single material.

Figure 8:
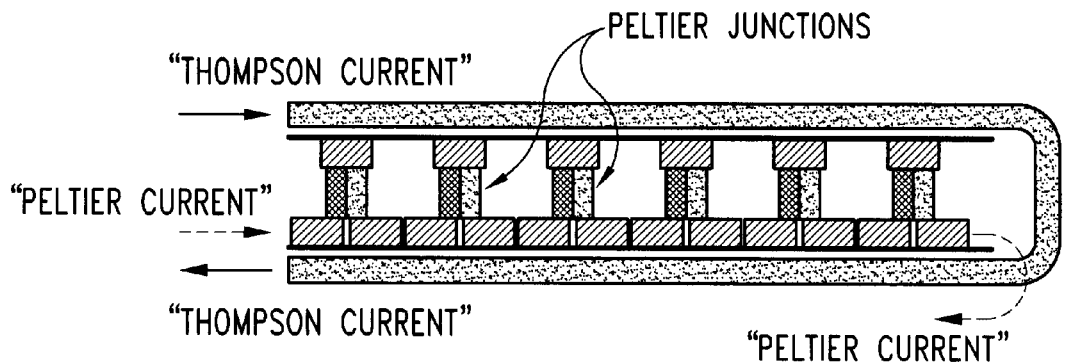
FIG. 8 illustrates one embodiment of a counter-current thermoelectric cooler according to the present invention.

FIG. 8 depicts one embodiment of a thermoelectric cooler that combines the aforementioned thermoelectric effects with the counter-current flow. The device includes counter-current exchange conductor, illustrated here as a bent path that reverses back on itself, where the Thompson current flow proceeds along the conductive path between a first conductive zone (upper zone) and a second conductive zone (lower zone). The current flows in substantially the opposite direction in the first conductive zone with respect to the second conductive zone. As used herein, substantially opposite direction means having a first current flow that is within a 90 degree angle of the direction exactly antiparallel to a second direction of current flow. FIG. 8 shows a plurality of Peltier junctions (as shown in more detail in FIG. 1) in thermoelectric contact between the first conductive zone and the second conductive zone of the counter-current exchange conductor. Although FIG. 8 shows a plurality of Peltier junctions, various embodiments of the invention are operable with at least one Peltier junction. The Peltier junctions include a heat transfer material at the top (T1) and bottom (T2) and, a first conductive material (upper conductor) in thermoelectric contact with the upper heat transfer material, and the same (or similar) first conductive material in thermoelectric contact with the lower heat transfer material. The first conductive material is also in conductive contact with a second conductive material (e.g., N-type) which is different than the first conductive material for directing electron flow in one direction across the junction. It also includes a third conductive material (e.g., p-type) which is different from the second conductive material and which is in thermoelectric contact with the heat transfer material and in conductive contact with the first conductive material.

Figure 9:
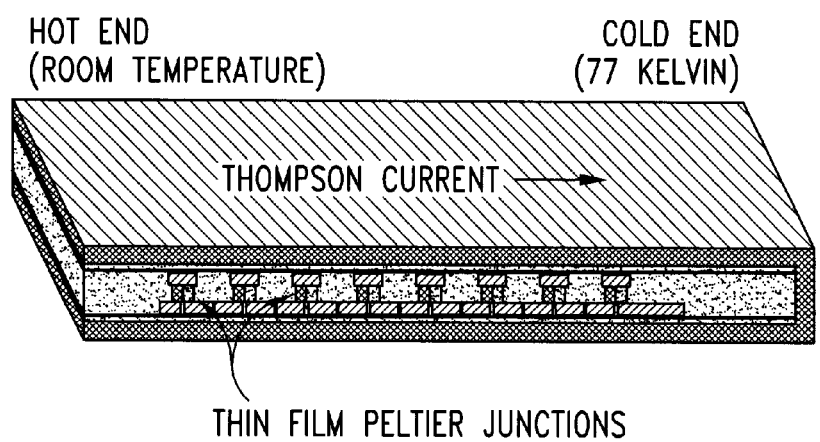
FIG. 9 illustrates predicted cooling performance of one embodiment of the counter-current thermoelectric cooler according the present invention.

As current flows from the first zone, a portion of the current crosses the upper heat transfer material (T1) and the first (upper) conductive material and passes down the p-type conductor to the first (lower) conductive material and through the lower heat transfer material to enter the lower zone of the counter current flow. Exactly the opposite occurs for current flowing in the opposite direction. The result is that the current flow across each Peltier junction transfers heat from T1 to T2 (and in reverse). When the arrangement is incrementally repeated along successive Peltier junctions, the net result is a temperature gradient having a hot end near the entry point of the current flow and a cold end proximal to the bend between the zones of counter current flow. FIG. 9 illustrates another embodiment wherein a similar structure is provided using thin filmed semiconductor material as part of the counter-current exchange path and/or the first and/or second conductive materials of the Peltier junctions. Such a device made of thin filmed materials provides a miniature thermoelectric cooler device suitable for use in a variety of electronic applications.

Any of the thermoelectric coolers provided herein may be referred to as "Counterflow Exchange Peltier Cooler" (CEPC). CEPCs operate at high efficiency because the temperature difference that each junction pair operates at is very small. It should be able to reach large temperature differences between its ends because the heat pumped from cooler regions will not flow through the Peltier junctions in warmer regions. Even though the strength of the Peltier effect is decreased as the temperature of the junction is reduced so the heat pumping rate per junction will be lower at the cold end of the device, the small temperature difference between the two faces of the device at each point along its length will maintain high thermoelectric efficiency. This allows the use of relatively small currents, thereby drastically reducing Joule heating which normally limits the achievable minimum temperature.

Another advantageous feature of the CEPC device is that, in contrast with standard Peltier coolers, the "hot" end of the device will only be slightly above room temperature. Whereas the heat pumped (and generated) by a standard Peltier cooler is exchanged with the air by a combination of thermal radiation and thermal conduction, both of which require high temperatures, the present counterflow cooler exchanges heat with the electric current flowing through the "Thompson loop." The amount of heat transported out of the device depends on the product of the Thompson current and the exit temperature, so a large current allows a small exit temperature. Preliminary calculations indicate that it will be possible to reach 100 degrees Kelvin with the warm end of the device at only 2 to 5 degrees above ambient temperature.

Based on standard approximations, the equations which describe the performance of the new cooler depend on assigning discrete temperature nodes at the top and bottom of each Peltier device can be represented as follows:

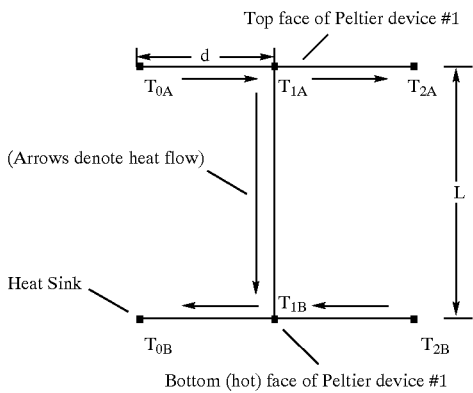

Taking the sum of the heat flows into the top face of the first Peltier device and setting to equal to zero (the equilibrium condition), the equation for node $T_{1A}$ is:

$$T_{1A}\left(\sigma I_{loop} + 2K_{loop}\frac{wa}{d} + \alpha_{AB}I_P - K\frac{w\delta}{L}\right) -$$
$$\left(K_{loop}\frac{wa}{d}\right)T_{2A} - \left(\sigma I_{loop} + K_{loop}\frac{wa}{d}\right)T_{0A} +$$
$$\left(\alpha_{AB}I_P - K_P\frac{w\delta}{L}\right)T_{1B} - \left(\frac{I_{loop}^2\rho_{loop}d}{aw} + 1_P^2\frac{P_pL}{w}\delta\right) = 0$$

Likewise, the equation for $T_{1B}$ is found to be:

$$T_{1A}\left(\alpha I_{loop} + K_P\frac{w\delta}{L}\right) - T_{1B}\left(K_P\frac{w\delta}{L} - \alpha I_{loop} - K_{loop}\frac{wa}{d} + K_{loop}\frac{wa}{d} - \sigma I_{loop}\right) +$$
$$T_{2B}\left(\sigma I_{loop} + K_{loop}\frac{wa}{d}\right) + T_{0B}\left(K_{loop}\frac{wa}{d}\right) + \rho_P\frac{I_P^2L}{w\delta} + \rho_{loop}\frac{I_{loop}^2 d}{aw} = 0$$

where δ is the combined thickness of the legs of the Peltier device, α is the height of the Thompson loop, and w is width of the Peltier device and Thompson loop, with the other parameters have been defined previously (the subscripts P and loop denote the parameters for the Peltier device and the Thompson loop, respectively).

Figure 10:
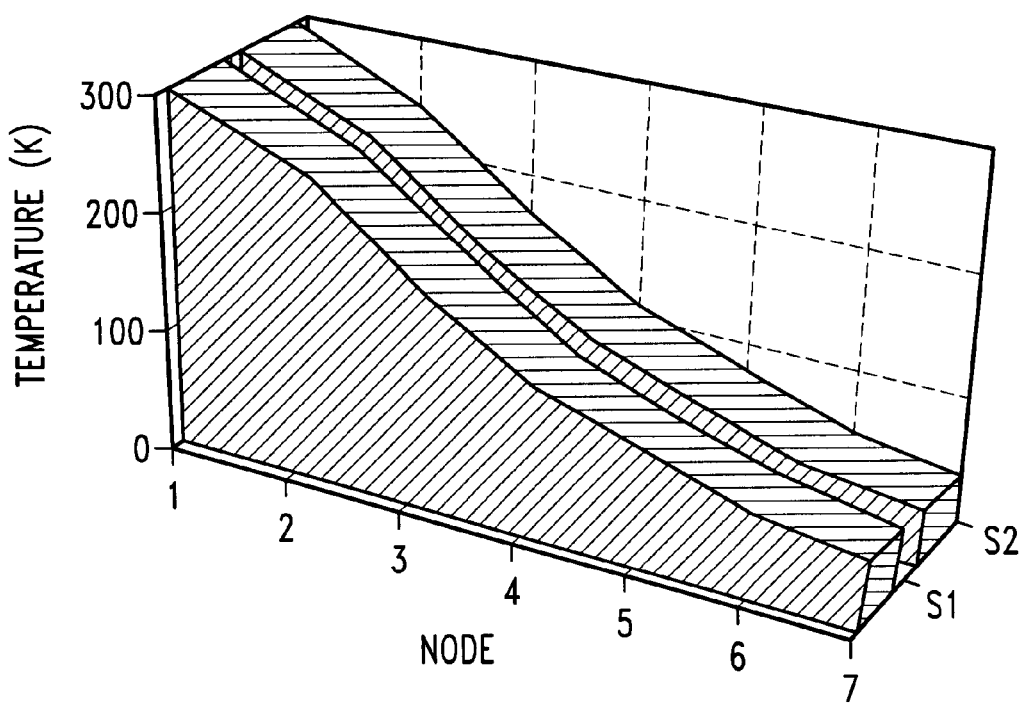
FIG. 10 illustrates another embodiment of a counter-current thermoelectric cooler according to the present invention.

In some applications, these equations are not realistic of cryogenic temperatures. The Peltier and Thompson coefficients, as well as the resistivity and thermal conductivity, are all temperature-dependent. Also, standard approximations result in equations which permit negative absolute temperature—a clearly unrealistic situation. However, assuming reasonable room-temperature values of the coefficients and currents, a calculated performance of a CEPC cooler using only six junctions obtained the results shown in the graph of FIG. 10. A typical device contains more junctions—on the order of 20 or more—because the thermoelectric performance of a junction declines by a factor of about 150 when operating temperature is reduced from 300 K to 85 K.

It is possible to construct a counterflow exchange solid state capable of maintaining a temperature of 100 to 77 degrees Kelvin under a heat load of 2 milliwatts, if the junction materials are carefully chosen for each node. It is known, for example, that "phonon drag" effects in certain semiconductors can lead to anomalously large Seebeck coefficients below 100 K, which improves thermoelectric performance. Junction materials that include $(Bi,Sb)_2(Te,Se)_3$ provide a ΔT of 3 degrees Celsius at 85 K. Also, recent work has shown that thermal conductivity can be dramatically reduced by forming the junctions from sintered powder.

Bibliography. The following references may further aid in understanding or implementation of various aspects of the present invention and are hereby incorporated by reference:

1. Frigichip® *Thermoelectric Cooling Devices* Melcor Engineering Catalog 1994.
2. Atramet, Inc. thermoelectric coolers catalog, 1994.
3. Atramet, Inc., private communication Sept., 1994.
4. H. J. Goldsmid, *Thermoelectric Refrigeration* Plenum Press 1964.
5. H. J. Goldsmid, *Electronic Refrigeration* Pion Limited 1986.
6. *Thermoelectric Materials* ed. Marshall Sittig, Noyes Data Corporation 1970.
7. E. Behnen,, "Quantitative examination of the thermoelectric power of n-type SI in the phonon drag regime," *J. Appl. Phys* 67(1), Jan. 1, 1990.
8. A. A. Joraide, "The effect of anisotropy on the electrical properties of compacted semiconductor $(Bi_2Te_3)_{25}$-$SB_2TE_3)_{75}$ powders", *J. Appl. Phys.* 73(11), Jun. 1, 1993.
9. J. Vandersande, J-P Fleurial, J. Beaty and J. Rolfe, "Phonon-Scattering Centers Increase Thermoelectric Efficiency," NASA Tech Briefs, August 1994.
10. J. Jinenez, E. Rojas, and M. Zamora, "Device for simultaneous measurement of the Peltier and Seebeck coefficients: Verification of the Kelvin relation," *J. Appl. Phys.* 56(11), Dec. 1, 1984.

From the foregoing it will be appreciated that, although specific embodiments of the invention have been described herein for purposes of illustration, various modifications may be made without deviating from the spirit and scope of the invention. Accordingly, the invention is not limited except as by the following claims.

What is claimed is:

1. A thermoelectric cooling apparatus comprising, a counter-current exchange conductor having a conductive path between a first conductive zone and a second conductive zone, where current flows in substantially an opposite direction in the first conductive zone with respect to the second conductive zone; and a Peltier junction in thermoelectric contact between the first conductive zone and the second conductive zone.

2. The thermoelectric cooling apparatus of claim 1 comprising a plurality of Peltier junctions in thermoelectric contact between the first conductive zone and the second conductive zone.

3. The thermoelectric cooling apparatus of claim 1 wherein the Peltier junction comprises a heat transfer material, a first conductive material in thermoelectric contact with the heat transfer material and in conductive contact with a second conductive material different than the first conductive material, and a third conductive material different from the second conductive material, the third conductive material in thermoelectric contact with the heat transfer material and in conductive contact with the first conductive material.

4. The thermoelectric cooling apparatus of claim 3 wherein the heat transfer material comprises a warming region and a cooling region, the warming region being in thermoelectric contact with first zone of the counter-current exchange conductor and the cooling region being in thermoelectric contact with the second zone of the counter-current exchange conductor.

5. The thermoelectric cooling apparatus of claim 3 wherein the second or third conductive material comprises $(Bi,Sb)_2(Te,Se)_3$.

6. The thermoelectric cooling apparatus of claim 1 comprising a plurality of Peltier junctions in thermoelectric contact between the first conductive zone and the second conductive zone, and wherein each of the plurality of Peltier junctions comprises a heat transfer material, a first conductive material in thermoelectric contact with the heat transfer material and in conductive contact with a second conductive material different than the first conductive material, and a third conductive material different from the second conductive material, the third conductive material in thermoelectric contact with the heat transfer material and in conductive contact with the first conductive material.

7. The thermoelectric cooling apparatus of claim 6 wherein the heat transfer material comprises a warming region and a cooling region, the warming region being in thermoelectric contact with first zone of the counter-current exchange conductor and the cooling region being in thermoelectric contact with the second zone of the counter-current exchange conductor.

8. The thermoelectric cooling apparatus of claim 1 comprising a cold end and a hot end, wherein the hot end is about room temperature and the cold end is about 70–100 degrees K.

9. The thermoelectric cooling apparatus of claim 6 wherein the second or third conductive material comprises $(Bi,Sb)_2(Te,Se)_3$.

10. A device comprising the thermoelectric cooling apparatus of claim 1.

11. The device of claim 10 wherein the device is a superconductive quantum interference device.

12. A method of cooling an object, comprising, forming a counter-current exchange conductor to have a conductive path between a first conductive zone and a second conductive zone; so that current passing through the counter-current exchange device flows in substantially an opposite direction in the first conductive zone with respect to the second conductive zone;

forming a Peltier junction in thermoelectric contact between the first conductive zone and the second conductive zone;

passing current through the counter-current exchange conductor through a circuit that includes the Peltier junction to form a cold end; and cooling the object by placing it in radiant, thermoconductive, or conductive contact with the cold end.

13. A method of generating electricity from a temperature gradient comprising, forming a counter-current exchange conductor to have a conductive path between a first conductive zone and a second conductive zone; so that current passing through the counter-current exchange device flows in substantially an opposite direction in the first conductive zone with respect to the second conductive zone;

forming a Peltier junction in thermoelectric contact between the first conductive zone and the second conductive zone;

positioning a first portion of the current exchange conductor in proximity to a substance having a first temperature and positioning a second portion of the current exchange conductor in proximity to a substance having a second temperature; and drawing electricity from the first or second conductive zones.

* * * * *